United States Patent [19]

Merritt et al.

[11] Patent Number: 5,331,234
[45] Date of Patent: Jul. 19, 1994

[54] SOLID STATE SWITCH

[75] Inventors: Bernard T. Merritt; Gary R. Dreifuerst, both of Livermore, Calif.

[73] Assignee: The United States of America as represented by the United States Department of Energy, Washington, D.C.

[21] Appl. No.: 897,730

[22] Filed: Jun. 12, 1992

[51] Int. Cl.$^5$ .......................... H03K 17/72; H03K 3/57
[52] U.S. Cl. .................................... 307/631; 307/641; 307/645; 328/67
[58] Field of Search ....................... 307/641, 645, 631; 328/67

[56] References Cited

U.S. PATENT DOCUMENTS

| | | | |
|---|---|---|---|
| 3,424,948 | 1/1969 | Ravas | 307/641 |
| 3,573,508 | 4/1971 | Harris | 307/284 |
| 3,596,168 | 7/1971 | Hengsberger | 307/641 |
| 3,646,395 | 2/1972 | De Pratti | 315/242 P |
| 3,662,189 | 5/1972 | Robinson et al. | 328/67 |
| 3,781,690 | 12/1973 | Corson | 328/67 |
| 3,794,908 | 2/1974 | Lindblom et al. | 307/641 |
| 4,084,206 | 4/1978 | Leowald et al. | 307/641 |
| 4,207,540 | 6/1980 | Ernst | 331/94.5 P E |
| 4,245,194 | 1/1981 | Fahlen et al. | 331/94.5 D |
| 4,275,317 | 6/1981 | Laudenslager et al. | 307/415 |
| 4,288,758 | 9/1981 | Seguin et al. | 331/94.5 |
| 4,398,156 | 8/1983 | Aaland | 328/233 |
| 4,494,236 | 1/1985 | Sutter, Jr. | 372/25 |
| 4,613,932 | 9/1986 | Cibulka et al. | 307/641 |
| 4,674,022 | 6/1987 | Ver Planck | 363/57 |
| 4,677,636 | 6/1987 | Laudenslager et al. | 372/68 |
| 4,698,518 | 10/1987 | Pacala | 307/106 |
| 4,700,284 | 10/1987 | Yoshizumi et al. | 307/641 |
| 4,825,272 | 4/1989 | Lehmann | 357/38 |
| 4,827,272 | 5/1989 | Davis | 343/702 |
| 4,975,924 | 12/1990 | Iwata et al. | 372/56 |

OTHER PUBLICATIONS

F. Ogata et al, "Development of 125KV 1,200 A Oi-1-immersed Thyristor Valve", Hitachi Rev. (Japan) vol. 23, No. 11 Nov. 1974 pp. 401–406.
"The Use of Saturable Reactors As Discharge Devices For Pulse Generators," W. S. Melville, B.Sc.(Eng)., Associate Member, Paper No. 1034, Radio Section, Cambridge Radio Group (Sep. 15, 1950).
"Basic Principles Covering The Design of Magnetic Switches," by D. L. Birx, E. J. Lauer, L. L. Reginato, J. Schmidt, M. Smith, Lawrence Livermore Laboratory UCID-18831, Nov. 18, 1980.
"The Application of Magnetic Pulse Compression To the Grid System of the ETA/ATA Accelerator," D. L. Birx, E. G. Cook, L. L. Reginato, J. A. Schmidt, M. W. Smith, Lawrence Livermore National Laboratory, Livermore, Calif. 94550, IEEE Fifteenth Power Modulator Symposium, Jun. 14–16, 1982.
"High-Power Pulse Generation Using Semiconductors and Magnetic Cores," Edward M. Lassiter, Paul R. Johannessen, Richard H. Spencer, AIEE Pater No. 60-870 (Jun. 19, 1960).
"High-Power Semiconductor-Magnetic Pulse Generators," Godfrey T. Coate, Laurence R. Swain, Jr., Research Monograph No. 39, The M.I.T. Press. Cambridge, Mass., pp. 1–7 (1966).
"Transformers," James P. O'Loughlin, Air Force Weapons Laboratory, Pulsed Power Lecture Series, Lecture No. 18, Plasma and Switching Laboratory, Department of Electrical Engineering, Texas Tech University, Lubbock, Tex. 79409, pp. 10, 12–13 (1979).
"Achieving Complete Turn-On In Large Area Thyristors," Sridhar R. Babu, Wilbur R. Comstock, Frank (List continued on next page.)

Primary Examiner—John Zazworsky
Attorney, Agent, or Firm—Henry P. Sartorio; Roger S. Gaither; William R. Moser

[57] ABSTRACT

A solid state switch, with reverse conducting thyristors, is designed to operate at 20 kV hold-off voltage, 1500 A peak, 1.0 μs pulsewidth, and 4500 pps, to replace thyratrons. The solid state switch is more reliable, more economical, and more easily repaired. The switch includes a stack of circuit card assemblies, a magnetic assist and a trigger chassis. Each circuit card assembly contains a reverse conducting thyristor, a resistor capacitor network, and triggering circuitry.

18 Claims, 4 Drawing Sheets

OTHER PUBLICATIONS

W. Kalkbrenner, Conference Record, Industry Applications Society, IEEE-IAS-1983 Annual meeting, Oct. 3, 1983, IEEE Catalog No. 83 CH1900-0.

"Reverse Conducting Thyristors Replace Thyratrons in Sub-Microsecond Pulse Generation," J. Vitins, J. L. Steiner and A. Schweizer (1987).

"Thyratrons in High-Current Pulse Applications," J. L. Steiner, A. Schweizer and J. Vitins, BBC Brown Bovari AG, High Power Semiconductors, CH-5401 Baden, Switzerland (1988).

"Power Semiconductor Devices For Sub-Microsecond Laser Pulse Generation," J. Vitins, J. L. Steiner, A. Schweizer and H. Lawatsch, Asea Brown Boveri Ltd., High Power Semiconductors, Switzerland, 1988 (IEEE).

"High di/dt Switching With Thyristors," J. L. Hudgins, V. A. Sankaran, W. M. Portnoy, and K. M. Marks, Department of Electrical and Computer Engineering, University of South Carolina, Columbia, S.C 29208, 1988 IEEE.

"Development and Operation of a Solid-State Switch For Thyratron Replacement," B. T. Merritt and G. R. Dreifuerst, Jun. 14, 1991, UCRL-JC-105355, Preprint Eighth IEEE International Pulsed Power Conference.

"High Average Power Magnetic Modulator For Copper Lasers," E. G. Cook, D. G. Ball, D. L. Birx, J. D. Branum, S. E. Peluso, M. D. Langford, R. D. Speer, J. R. Sullivan, and P. G. Woods, Jun. 14, 1991, UCRL-JC-105816, Preprint Eighth IEEE International Pulsed Power Conference.

"Reliable, High Repetition Rate Thyratron Grid Driver Used With A Magnetic Modulator," James V. Hill, Don G. Ball, and D. N. Garrett, Jun. 14, 1991, UCRL-JC-105815, Preprint Eighth IEEE International Pulsed Power Conference.

SOLID STATE SWITCH

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The field of the present invention is generally directed to a solid-state switch. More specifically, the field of the present invention is directed to a solid-state switch for discharging an intermediate energy storage capacitor into a magnetic compression circuit for powering a laser, or for other applications requiring high current pulses.

2. Description of Related Art

Applications requiring very high current pulses of extremely short duration have steadily increased in number. One such application is a power supply for laser systems used in both industry and research. For the generation of high power pulses, voltages up to 20 kV generally must be switched in fractions of a microsecond.

Previously, this extremely short duration switching has been almost the exclusive domain of the electron tube or thyratron. Thyratrons, however, suffer from a number of disadvantages. Chief among these disadvantages is their limited effective lifespan. In applications to discharge a storage capacitor, such as into a magnetic compression circuit for high voltage applications, e.g. a laser, a thyratron experiences a characteristic operating life of some 1200 hours with a maximum lifespan of some 2500 hours.

A resultant second disadvantage of the thyratron therefore relates to its operating cost per unit-hour. The per unit cost of a conventional thyratron for high voltage applications is quite expensive and generally falls in the range of $6,000-$7,000 per unit. Once the thyratron fails which as noted above occurs often within a median operating life of some 1200 hours, the operating cost of a thyratron measured on a per hour basis averages approximately $5.50 per hour. This comparatively high per hour operating cost limits the applications for which the thyratron may be considered.

The use of thyristor switches for pulse generation is known. For example, Vitins, et al. Power Semiconductor Devices For Submicrosecond Laser Pulse Generation, ASEA Brown Boveri, Ltd. (1988); Vitins, et al. Reverse Conducting Thyristors Replace Thyratrons In Sub-microsecond Pulse Generation, BBC Brown Boveri, Ltd. (1987); Steiner, et al., Thyratrons In High-Current Pulse Applications, BBC Brown Boveri, AG (1988) and references cited therein disclose the use of thyristors with interdigitated, amplifying gate structures to provide very short high current pulses.

However, the conventional devices described in the foregoing references fail to address the problem of switch jitter. The elimination of jitter is crucial to ensure constant operation over a virtually unlimited number of current pulses for laser applications. The elimination of switch jitter is especially important as one increases the generation of high power pulses. If firing jitter is not controlled, circuit performance is degraded particularly when using magnetic compression techniques.

In addition, conventional RCT devices require overvoltage protection to protect the RCTs, particularly when RCTs are configured in a series stack. The importance of limiting jitter and providing overvoltage protection to prevent the literal burnout of the SCR portion of a conventional RCT device at extremely high frequencies may be explained as follows. Conventional devices which use RCTs to produce submicrosecond pulses discharge a high voltage capacitor to drive a load such as a laser. In conventional devices, RCTs are linked together in series and are triggered simultaneously. A high voltage capacitor then discharges through a magnetic assist and through all the RCTs in series and into the load. Prior art has not been demonstrated at more than four RCTs in series, nor has the problem of switch jitter been addressed.

One aspect of the present invention incorporates overvoltage protection through the use of break-over diodes (BODs). Known prior art devices have identified the use of BODs for this application. However, the present invention solves the problem of a subtle noise induced failure mechanism of the BOD due to stray capacitance, which is not addressed by the prior art. It has been found that when using a relatively large number of RCTs in series, the stray capacitance associated with each RCT can result in false triggering effects caused by BOD failure.

SUMMARY OF THE INVENTION

The present invention addresses the above and other disadvantages of conventional thyratrons and conventional uses of RCTs for generating high pulse frequencies.

The present invention, while generally directed to a high voltage solid state switch, is specifically directed to an improved switch to discharge an intermediate energy storage capacitor into a magnetic compression circuit to power a laser. In a preferred embodiment, the switch itself comprises a plurality of circuit card assemblies, a magnetic assist, and a trigger chassis. Each circuit card assembly includes a reverse conducting thyristor, energy storage means in the manner of a resistor-capacitor network and triggering circuitry.

The solid state switch of the present invention offers a number of advantages over thyratrons and other solid state circuits. One advantage of the present invention relates to extended operating life and thus reduced operating costs. This operating life is enhanced since the switch of the present invention may be repaired once it has failed.

One object of the present invention is to provide extremely short, controlled high current pulses for powering high energy lasers. For the generation of high power pulses, voltages in the neighborhood of 20 kV must be switched in fractions of a microsecond without firing jitter.

Another object of the present invention is to provide a switch capable of producing extremely short, high current pulses for a high energy laser or the like with overvoltage protection to prevent damage to RCTs during voltage transients. This enables more RCTs to be switched simultaneously than has been stated in the prior art. For example, the present invention provides preferably two sets of eleven switching devices (RCTs) connected in series. The 22 RCTs are switched simultaneously to provide current pulse widths of one microsecond $\mu s$ or less. This enables a high energy laser to be pulsed at approximately 4.5 kHz and to achieve substantially continuous operation. This has not been demonstrated in the prior art using RCTs as switching elements.

The switch of the present invention also makes possible greatly reduced current pulse widths in the submicrosecond range.

For example, the present device enables a laser to be pulsed at approximately 4.5 kHz while substantially higher circuit performance than is possible using conventional switching devices. A switch in accordance with the present invention is capable of limiting switch jitter to ±1 nanosecond at approximately 5,000 A. No electron tube known can meet the requirement of 1 nanosecond jitter at a pulse width of less than 1 microsecond, at these power levels.

Additional advantages include controlled voltage degradation allowing for preventative maintenance and repairability.

Additional and other advantages of the present invention may be seen by reference to following description of the preferred embodiment in reference to the attached drawings.

DESCRIPTION OF THE PREFERRED EMBODIMENT

One function of the solid state switch of the present invention is to discharge a high voltage storage capacitor (H.V. CAP) 103 into a magnetic compression circuit for providing extremely controlled short duration submicrosecond pulses powering a laser (load 105). A preferred embodiment of this switch is illustrated by block diagram in FIG. 1A and schematically in FIG. 1B, and generally comprises a plurality of circuit card assemblies 102, arranged in a so called "stack", shown at 101 in FIG. 1A, a magnetic assist 104 and a trigger chassis 106.

Figure 1A:
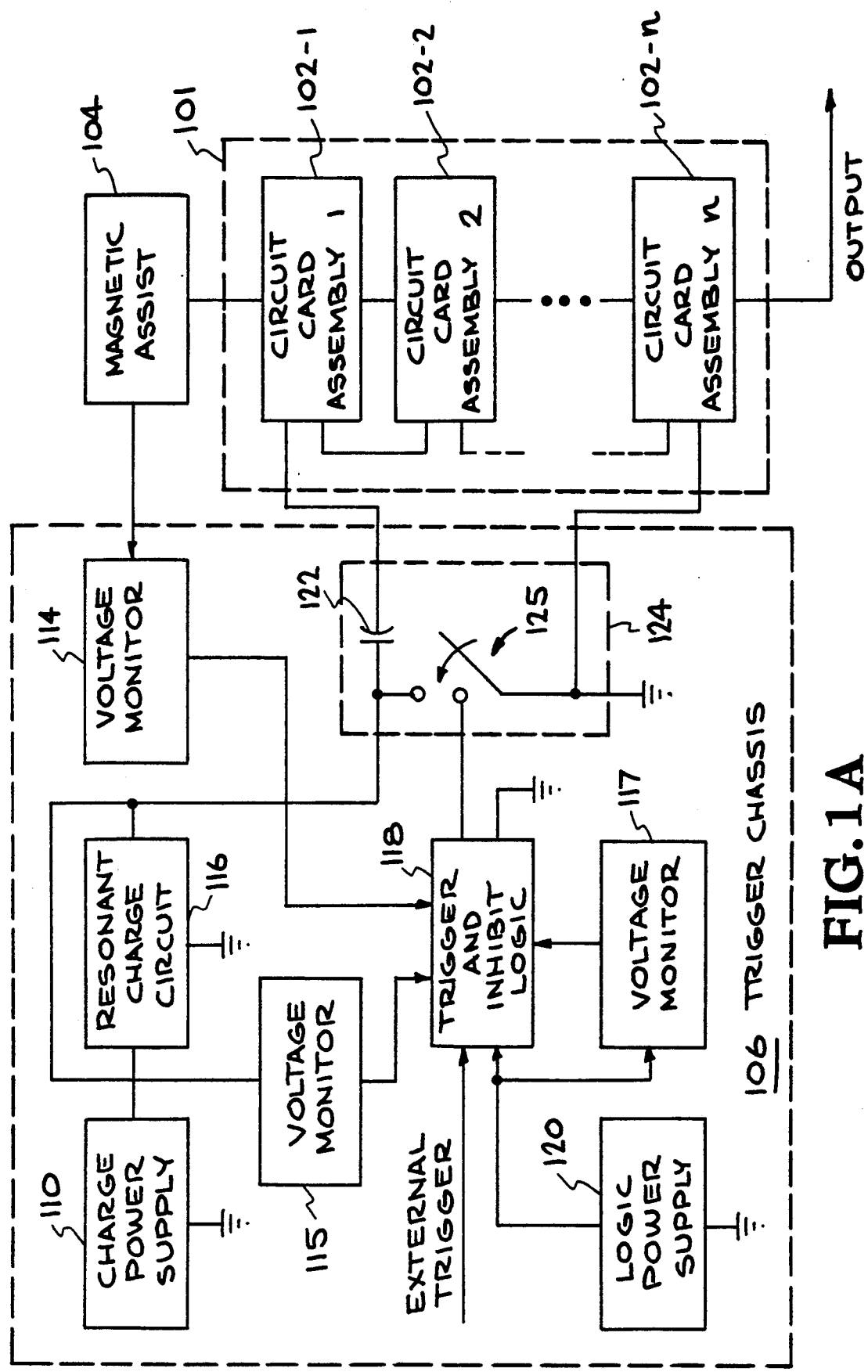
FIG. 1A represents a block diagram of the switch of the present invention.
Figure 1B:
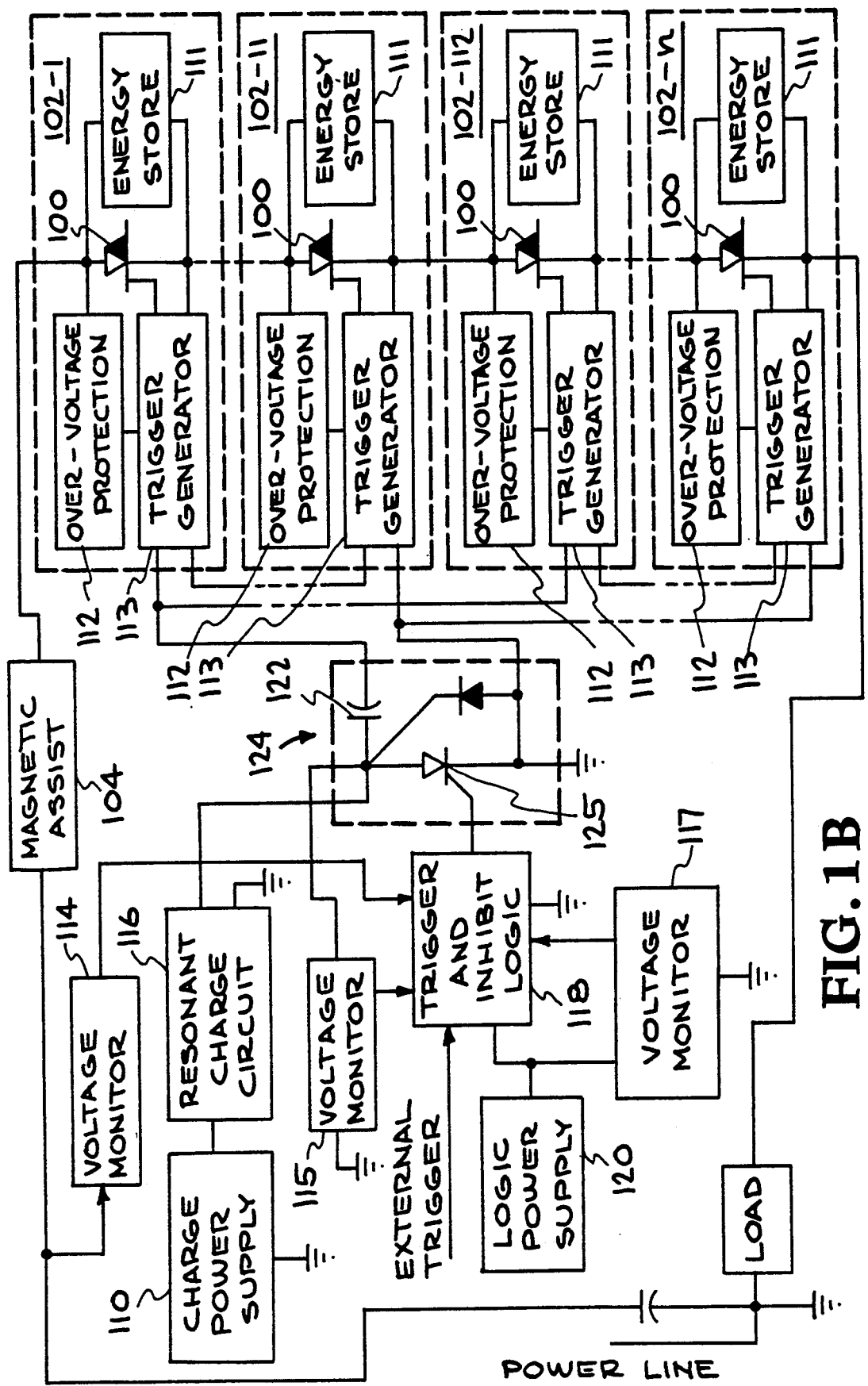
Fig. 1B represents a schematic diagram of the circuit card assembly and overall system block diagram of a preferred embodiment of the invention.

By reference to FIGS. 1A, 1B, each circuit card 102 contains a reverse conducting thyristor (RCT) 100, an energy storage means 111, and trigger generator 113 which includes a pulse transformer 208 (shown in FIG. 2A, B) and an over-voltage protection circuit 112 as will be further discussed herein. In the embodiment of the circuit card 102 illustrated in FIGS. 2A and 2B, the RCT 100 incorporates a highly interdigitated gate structure. The interdigitated gate structure increases the area of interface between the amplifying gate and cathode periphery of the RCT device. This maximizes the velocity of the plasma spread and the switching speed of the RCT.

Figure 2A:
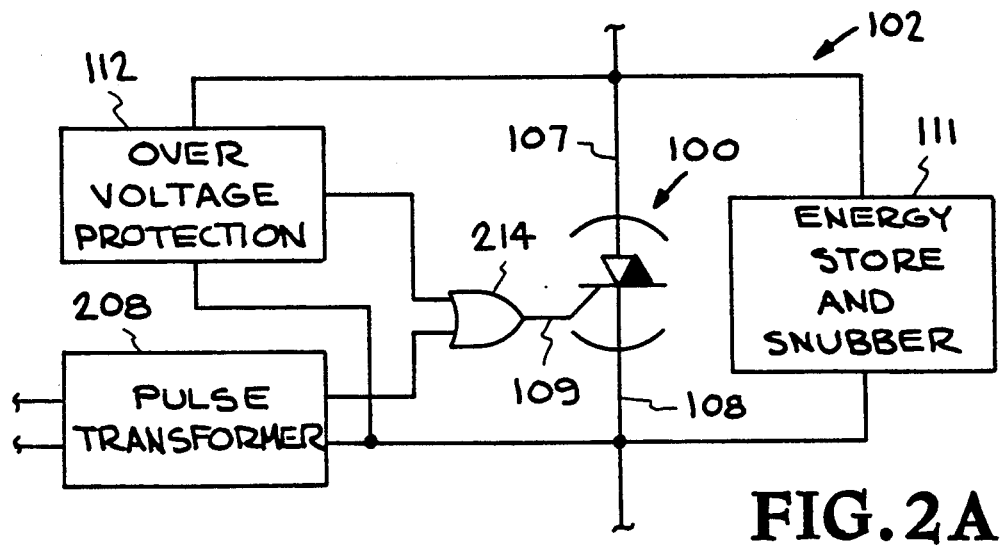
FIG. 2A represents a block diagram of the circuit card assembly of the present invention.

As shown in FIG. 2A, RCT 100 has three leads, an input lead 107, an output lead 108, and a gate (or control) lead 109.

When using any type of thyristor for this application, it is essential that the thyristor be capable of accommodating large rate-of-rise currents. In order to do this, the thyristors must turn-on as fast as possible. The most common and well known technique for creating a very fast turn-on device is to use a highly interdigitated amplifying gate structure. The term Interdigitation refers to the creation of a number of "fingers" of an amplifying gate structure. The fingers create a much larger periphery of an amplifying gate structure which creates a greater area for conducting a high current pulse with a minimum of turn on losses. The gate current initially fires the amplifying gate and a resulting larger current then activates the entire interdigated gate periphery to conduct the load pulse current. This larger periphery causes the rest of the thyristor to turn-on as fast as possible, as is well known by those skilled in the art.

The reverse conducting thyristors (RCTs) 100 form the primary switching elements. Alternatives to using RCTs would be to use one normal asymmetric thyristor and antiparallel diode per circuit card assembly. An additional alternative would be a very fast symmetric thyristor. An asymmetric thyristor blocks voltage in only the forward direction; reverse voltages above a few volts will cause the device to fail. Symmetric thyristors can block voltage in either the forward or reverse direction. The advantage of using an asymmetric thyristor is that the thickness of the semiconductor material is less. Since conduction losses are directly proportional to the material thickness, the conduction losses of an asymmetric device are less than a symmetric device. When using a large number of devices in series, it is important to reduce the individual element losses to minimize the losses for the entire assembly.

The antiparallel diodes are used to protect the asymmetric thyristors from reverse voltages. The antiparallel diodes will conduct if a reverse voltage occurs. The reverse voltage across the asymmetric thyristors is then limited to the forward conducting voltage of the diode or one to two volts. Normally, whenever one uses an asymmetric thyristor, one places a diode in antiparallel for protection. The RCT builds the antiparallel diode onto the same substrate that contains the thyristor. This creates a very convenient package. The term, reverse conducting, arises from the fact that the diode will conduct if a reverse voltage is applied.

Figure 2B:
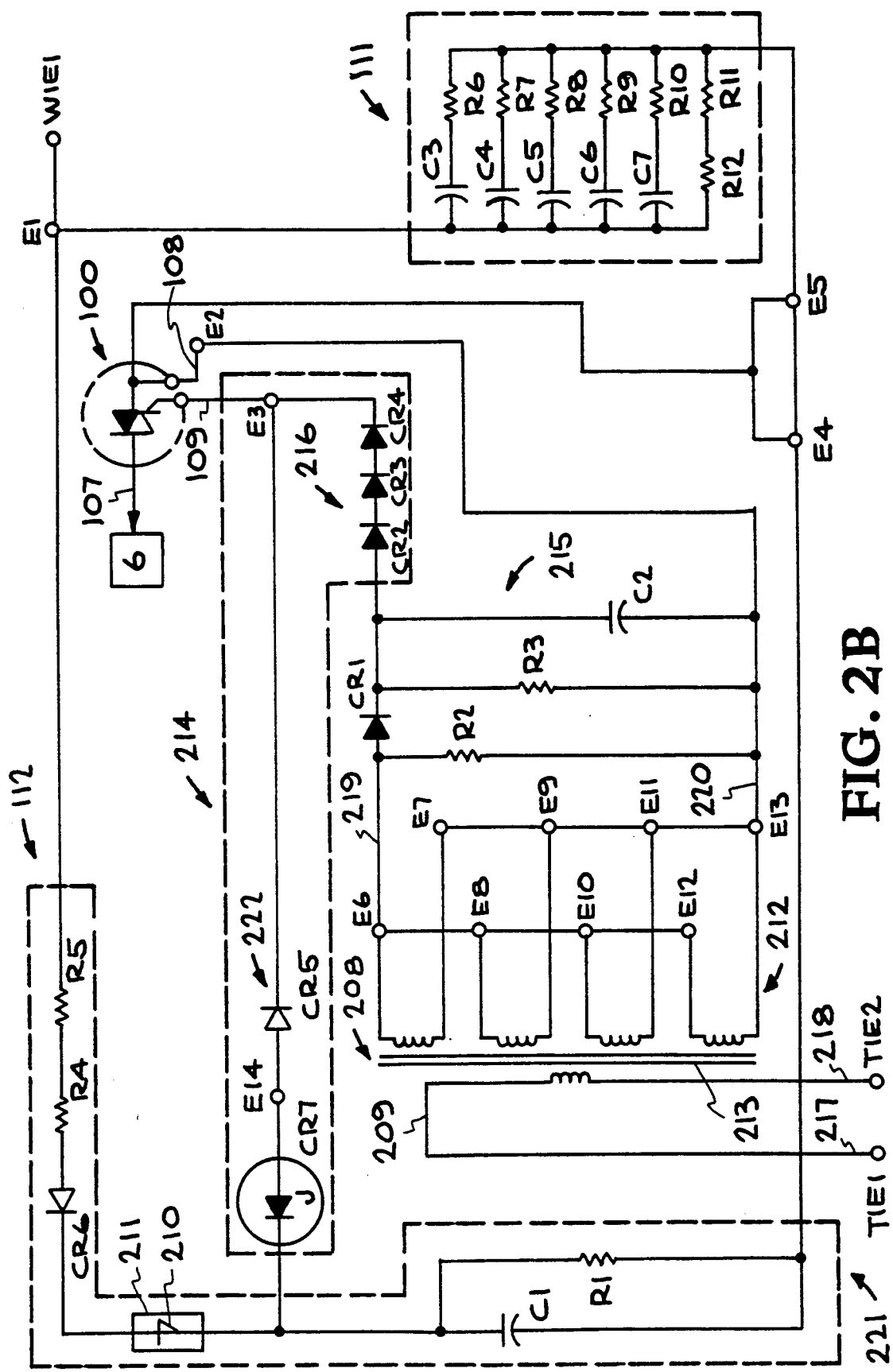
FIG. 2B represents a schematic diagram of the circuit card assembly of the present invention.

Referring again to FIGS. 2A and 2B, an energy storage means 111 is connected across the RCT 100. The storage means 111 also functions as a conventional snubber. Energy storage means 111 is comprised of a series connected capacitance and resistance. Representative values of the capacitors and resistors are shown in FIG. 2B. The values of the resistance and capacitance are optimized, as will be explained for each application. The size of the capacitance is chosen to ensure that adequate energy is provided to RCT 100 once the trigger pulse is received from the pulse transformer 208. This energy aids in actuating the RCT. Too much energy will cause the RCT 100 to fail due to localized heating of the substrate. This is especially true at the high repetition rates necessary for the desired application of the switch which may be in the range of 5-10 kHz. Similarly, insufficient energy will also result in a failure due to localized heating.

The value of the resistance is chosen to shape the current from the energy store into the RCT 100. In this connection, a relatively high peak current is desirable. However, too high a peak current will also result in a failure of the RCT. The optimum values for R and C minimize the conduction losses in the RCT 100.

In accordance with one aspect of the present device, the switch is provided with circuit means for protecting each of the circuit card assemblies 102 from overvoltages. In a preferred embodiment, each RCT switch 100 is provided with an overvoltage protection circuit 112 utilizing break-over diodes (BODs), shown at 210 in FIG. 2B, to initiate the triggering of the RCT 100 when the voltage across the circuit card assembly 102 exceeds the rated voltage of the BOD 210. The BOD 210 is a two terminal, four layer, avalanche device which is designed to conduct current after a precise voltage is exceeded. Thus, the BOD 210 also functions as a means for sensing an overvoltage condition. As a result, circuit card 102 triggers during an overvoltage.

BOD 210 produces a peal limited trigger pulse to trigger RCT 100 when an overvoltage condition exists. As shown in FIG. 2B, BOD 210 is in series with a standard diode CR6, resistors R4-5 which limit the peak of the pulse, and current pulse shaping means 221 for reducing high frequency oscillations in the pulse. Pulse shaping means 221 is an RC filter formed of resistor R1 and parallel capacitor C1. Circuit 112 is connected across input and output leads 107, 108 of RCT 100. The pulse from BOD 210 passes through pulse gating means 222 formed of diode CR5 to control lead 109.

The present invention anticipates possible failures by incorporating additional series connected switches 100 to provide for a higher hold-off voltage than is rated. For example, in the present invention, the peak forward voltage rating is 22×1300 V or 26,000 V, while operating routinely at 20,000 V. This allows one or more switching devices 100 to fail (by being shorted out) without necessitating a repair action. The overvoltage protection provided by BODs 210 prevents catastrophic failure of the switch assembly 102 due to overvoltage. Without such protection, it is quite likely that all of the devices could fail during an overvoltage condition. Preferably, the BODs 210 are rated at 1200 volts while the RCTs 100 are rated 1300 volts.

It will also be appreciated that one of the novel aspects of the present device is the minimization of stray capacitance. Stray capacitance is that capacitance between the switching elements 100 and ground. The use of multiple elements in series for high voltage applications always exacerbates the problem of stray capacitance. When elements such as RCTs 100 are placed in series, the stray capacitance between each element and ground becomes important because it may dominate the division of voltage across all the elements. Even when structures are built symmetrically, so that individual stray capacitances to ground are equal, during transient changes in voltage, the instantaneous voltage division may not be equal. During transients, the stray capacitance creates a complex circuit network resulting in unequal division of voltages. This may result in individual BODs triggering at undesired times if the stray capacitance is not controlled.

In a preferred embodiment each BOD 210 is shielded when operating with greater than ten circuit card assemblies in series in order to prevent false triggering caused by stray capacitance effects. The shielding is by means of a conductive element such as a ground plane as shown at 211 in FIG. 2B. Ground plane 211 comprises, in a preferred embodiment, a copper foil. The ground plane shielding may also comprise a plastic case covered with drawn copper. However, any suitable conductive material may be utilized as a ground plane. What is important is that the BOD is shielded. Shielding of the BODs closely controls the stray capacitance. As shown in FIG. 2B, it creates "stray" capacitance directly across the terminals of the BODs. This capacitance now dominates the voltage division problem resulting in greatly reduced false triggering. BODs 210 are particularly susceptible to stray capacitance effects because they are avalanche devices; they are designed to trigger at low power levels. It is contemplated that other avalanche devices may also be used to trigger the RCT 100 in case of overvoltage such as Zener diodes, or the like. Prior art does not disclose the use of shielded BODs or other avalanche devices in this context.

As shown in FIG. 2B, it will be appreciated that each RCT 100 is associated with a corresponding overvoltage protection network 112 which includes a break-over diode 210. Without the break-over diodes, the entire stack of the RCTs conceivably could fail in the event of an overvoltage. For example, if one or more RCTs failed, the voltage across the remaining series connected RCTs would increase to the point where the entire stack could fail.

The reliability of RCT 100 is dependent in large part by the shape, (i.e., rise time, peak value and pulse width) of the trigger pulse generated by pulse transformer 208 and trigger chassis 106 in FIG. 1A. Triggering of the switch represented by the stack 101 of RCTs 100 occurs in two ways. First, by the overvoltage protection circuit 112 during an overvoltage condition. Second, triggering of the switch is normally accomplished using a trigger pulse driver 124 to simultaneously drive the individual pulse transformers 208 for each RCT 100. As shown in FIGS. 2A, B the outputs of overvoltage protection circuit 112 and pulse transformer 208 are combined (represented by OR gate 214) on control lead 109 of RCT 100.

In the embodiment of the switch illustrated in FIGS. 1A-1B, eleven pulse transformers included in trigger generator networks 113 are connected in series with the two sets of primaries being connected in parallel. Other configurations, however, are also envisioned within the scope of the present invention. For example, the number of circuit card assemblies 102 connected in series or parallel may be varied to match the pulses to provide optimally fast switching speed.

Magnetic assist 104 represents a saturable inductor and is critical to the successful operation of the switch. Magnetic assist 104 provides a means for delaying the main current pulse to the circuit card assemblies 102 until the RCTs 100 are sufficiently actuated to accommodate large peak currents. Magnetic assist 104 includes cores made of ferrite, although other core materials such as amorphous metals or permalloy tape wound cores may also be used to accomplish the objectives of the invention.

The saturation time or hold-off time of the magnetic assist 104 is fabricated to match the actuation time of the RCT 100. In this connection, magnetic assist 104 must have a sufficient volt/seconds product to prevent the main current pulse through the switch from occurring prior to the actuation of the RCTs 100 in each of the circuit cards 102. In a preferred embodiment, magnetic assist 104 provides a hold-off time of 500 nanoseconds.

By reference to FIGS. 1A-1B, trigger chassis 106 comprises a charge power supply 110, logic power supply 120, voltage monitors 114, 115 and 117, resonant charge circuit 116, trigger and inhibit logic circuit 118, trigger driver 124 which includes capacitor 122 and a controlled, high speed closing switch 125. Trigger chassis 106 is connected to pulse transformers 208 (See FIG. 2B) which are part of the trigger generator 113 and are connected in series, or in series and parallel.

The trigger chassis 106 works as follows. A capacitor 122 is resonantly charged. The capacitor 122 is then discharged by means of the controlled high speed switch 125, in this embodiment, a small asymmetric SCR. The circuit is completed by the pulse transformer primaries 209 that reside on each circuit card assembly 102. The pulse transformer primaries 209 are connected in series, or series and parallel, in order to match the desired trigger pulse-width, peak current, and rise time.

The trigger and inhibit logic circuit 118 provides two functions. First, the external trigger is buffered and used to trigger the controlled high speed switch thereby causing the stack to be triggered. Second, the inhibit logic prevents failure of the RCTs on the circuit card assembly by inhibiting the controlled high speed switch 125 from triggering if certain conditions are not satisfied. These conditions are that there must be (1) a sufficient voltage across the stack 101, (2) the internal power supply 110 that powers the resonant charge circuit 116 must be operating at its designated value, and (3) the power supply 120 that powers the logic circuitry also must be at its designated value. If any of these three conditions are not met, the inhibit circuit 118 prevents the triggering of the controlled high speed switch 125.

As shown in FIG, 2B, primary 209 of transformer 208 is connected across first and second input leads 217, 218. A plurality of secondary windings 212 wound on a single core 213 are connected in parallel across first and second output leads 219, 220. The output of transformer 208 passes through rectifier and filtering means 215, formed of rectifier (diode) CR1 and filtering capacitor C2, to control lead 109 of RCT 100. Rectifier and filtering means 215 allows only pulses of proper polarity to pass and suppresses high frequency oscillations. Pulse gating means 216, formed of diodes CR2-4, between rectifier and filtering means 215 and control lead 109 allows trigger current pulses to flow in one direction only.

The voltage across the stack 101 is monitored to ensure that RCT device failures are prevented. This is counter-intuitive; one normally would think that the lower voltage across the switch, the less peak current through the switch would be conducted for a particular application, so that low voltage would not necessarily lead to a failure. However, there are two factors to consider. First, the lower voltage causes the hold-off time of the magnetic assist 104 to increase. It may then become so long that it no longer matches the trigger pulse, and may result in RCT failures. Second, the energy stored on each circuit card assembly 102(1)–102(n) also will be decreased with lower voltage; again, a point will be reached where the energy will be insufficient to adequately aid in the turn-on of the RCTs resulting in RCT failures.

The voltage of the charge power supply 110 is monitored to ensure that a trigger pulse of sufficient energy is generated each time. An alternative to monitoring the power supply voltage is to monitor the capacitor voltage across capacitor 122 directly. The point is to ensure that each trigger pulse is sufficient to activate the associated RCT.

The voltage of the logic power supply 120 is also monitored by voltage monitor 117 to ensure that the inhibit circuitry 118 can operate. Sufficient power for individual chips in the inhibit logic is provided by additional capacitors (not shown) across the chip's power leads. One could also use a battery backup system. The point of this scheme is to ensure proper operation of the protection circuits.

The normal trigger pulse is provided by discharging the capacitor 122 into the primaries 209 of the pulse transformers 208 on the circuit card assemblies 102(1)–102(n). This constitutes a voltage source trigger. This voltage source trigger scheme has been found to result in an overall switch jitter of less than 1 nanosecond. This minimization of firing jitter to less than 1 nanosecond was heretofore not possible using prior art devices which employ a current source trigger. The current source triggering techniques of known prior art devices have been found incapable of minimizing switch jitter to the extent of the present invention. Generally, in the prior art a shunt switch may be connected between an inductor and the primary of a pulse transformer. This shunt switch is normally closed generating a constant current in the inductor. When the shunt switch is opened, current transfers to the pulse transformer primaries, causing the RCTs to trigger. In experiments conducted using this conventional current source trigger scheme, the lowest jitter that was observable was about 5 nanoseconds.

The present invention solves the problem of switch jitter by using a voltage source trigger. This is set at about 40 V across each RCT gate. This is a large enough voltage so that all RCTs trigger at substantially the same time. In contrast, as set forth above, the prior art uses only a current source trigger. When using a current source trigger, jitter is poor because each RCT requires a minimum voltage across its gate to cathode junction before current will be conducted into the gate. When the shunt gate is opened, the voltage across the primaries of the transformers rises until the gates begin to conduct. This causes uneven firing of the RCTs and switch jitter. The most sensitive gate conducts first; followed by the second most sensitive and so on. Also, the overvoltage protection may begin interacting with normal triggering. As the individual RCTs are triggered, their voltage collapses, resulting in the transference of voltage to nonconducting RCTs. Eventually, the voltage across the RCTs not yet triggered may be high enough to cause the overvoltage protection scheme to trigger those devices.

The present invention advantageously overcomes this problem by using a voltage source trigger which provides a constant voltage across each RCT gate so that the RCTs can be triggered substantially simultaneously.

Successful operation of the present device is provided for by the interaction between the hold-off time of the magnetic assist 104, the energy stored in energy storage means 111, and the trigger wave shape. In accordance with another novel aspect of the device, performance of the device may be optimized for various applications by custom tuning certain parameters. This provides optimally fast switching speeds capable of handling voltages in a range of 20–30 kV.

In accordance with the present device, the current density of the SCR portion of the RCT is optimized for quick turn on. The quick turn on time of the RCT is optimized by adjusting the resistance and capacitance of the energy storage means as well as the trigger.

In selecting parameters for different applications both the peak value of the current and the pulse-width of the current must be considered. For shorter pulse-widths, the rate-of-rise of the current is usually higher than for longer pulse-widths. The larger the rate-of-rise, the more it is necessary to ensure that the solid-state device, i.e. RCT 100, is turned on as much as possible before the current is conducted. How much a particular model number thyristor is turned on depends on how much energy there is in the energy store 111 on each circuit card assembly 102 and the trigger waveform fed by the pulse transformers 208.

The RCT 100 first conducts along the periphery of the interdigitation of its gate. As the RCT 100 continues to turn on, more charge carriers are generated along the periphery. This plasma of charge carriers begins to spread throughout the remainder of the RCT 100. How fast this plasma spreads is dependent on the current density of the portion of the RCT already conducting. The higher the current density, the faster the plasma spreads causing more of the RCT to turn on. The present device, optimizes switching speed by providing just enough current density to cause the plasma to spread rapidly but not too much or the RCT will fail due to localized heating.

The magnetic assist 104 prevents conduction of the main current path until the RCTs 100 are sufficiently turned on. Higher peak currents for the same pulse-width require longer saturation times. Higher peak currents for longer pulse-widths don't necessarily require increasing the saturation time. The saturation time of the magnetic assist 104 depends on how long it takes to turn on the RCTs. Again, the purpose of the magnetic assist 104 is to delay the main current pulse until there are sufficient charge carriers in the RCTs to accommodate the large current pulses.

The requirements for the energy store 111 are similar to those for the magnetic assist 104. Higher peak currents for the same pulse-width usually require more energy to turn on the RCTs as fast as possible. The energy store requirements are strongly affected by the switch repetition rate. The lower the repetition rate the larger the energy store can be. At very high repetition rates, the size of the energy store is limited by the heating losses that occur in the amplifying gate structure during the turn on process.

Trigger requirements are less dependent on the current values and more dependent on system parameters. These parameters include the number of circuit card assemblies, and circuit parameters, such as current pulses due to reflections from the load, and repetition rate. These parameters determine the pulse-width of the trigger pulse and other parameters such as trigger voltage and current.

To enhance the performance and overall life of the switch, the switch assembly is immersed in a liquid coolant, e.g. freon. To protect the solder connections from degradation, a pyrelene coating may be applied. Alternate coolants, such as water are also contemplated within the spirit and scope of the invention.

EXAMPLE 1

An operating prototype of the embodiment of the invention illustrated in the drawings was designed to operate at specific operating parameters and tested for purposes of allowing a comparison between the switch of the present invention and a thyratron to discharge an intermediate energy storage capacitor into a magnetic compression circuit to power a laser. This switch consisted of a stack of 22 circuit card assemblies, a magnetic assist and a trigger chassis. The circuit card assemblies were arranged in two sets of eleven cards connected in series with the two sets connected in parallel.

Two of the design parameters for the prototype were that it operate at a one microsecond pulse width and at a peak current of 1250 A. At this extremely short pulse width, the RCT was never fully activated but current was instead conducted only along the interdigitation. The time necessary for the interdigitation area of the RCT to conduct current was dependent upon the triggering, the energy stored in energy storage means, and the rate of deposition of this energy into the RCT.

Each of the 22 circuit card assemblies in the prototype switch included an RCT having a design rating of 1300 V hold-off, 20 $\mu$s recovery-time, 325 A average current, and a highly interdigitated amplifying gate structure. While it was generally believed that very large gate drives allowed for the conduction of short pulse widths, e.g., pulse widths in the order of 1-5 microseconds, this was not apparent in the prototype since the RCT utilized an amplifying gate whereby the linear rate of charge current di/dt was maximized.

The reason for this departure from convention was due in part to the interaction of the magnetic assist and the resistor-capacitor energy store.

The gate current for each of the RCTs was chosen to reduce the operating requirements of the trigger chassis. Due to this reduced requirement, it was possible to modify an existing thyratron chassis to trigger the solid state switch. The gates themselves were voltage source triggered in order to meet a minimum jitter requirement of ±1 ns.

Figure 3:
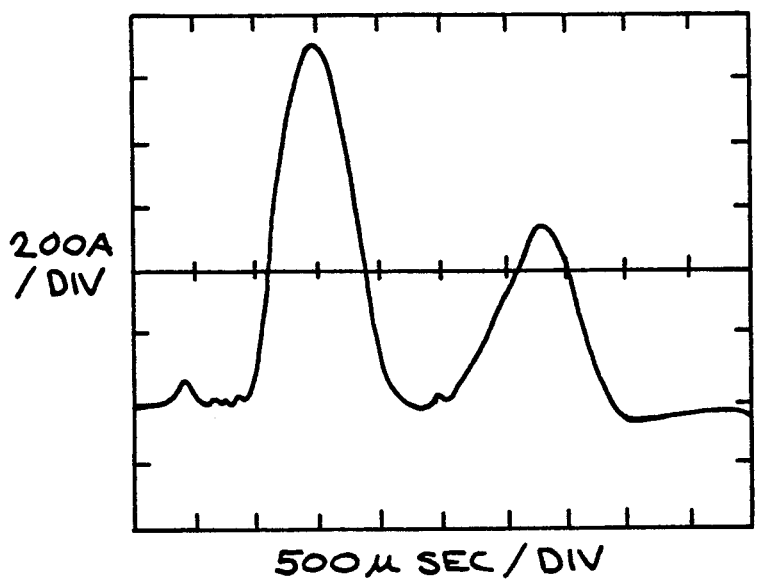
FIG. 3 diagrammatically represents a typical switch trigger pulse waveform.

FIG. 3 diagrammatically illustrates a typical current pulse created through the prototype thyristor replacement switch as described above. FIG. 3 shows the presence of two positive half-sinusoid waveforms. The first half-sinusoid represents the normal discharge of the intermediate storage capacitor 122. The second half-sinusoid results from a reflection off the load traveling back to the switch. This second half-sinusoid requires that the pulse-width of the trigger pulse be extended to ensure full switch conduction. That is, the gates of the RCTs are charged during this second pulse.

Figure 4:
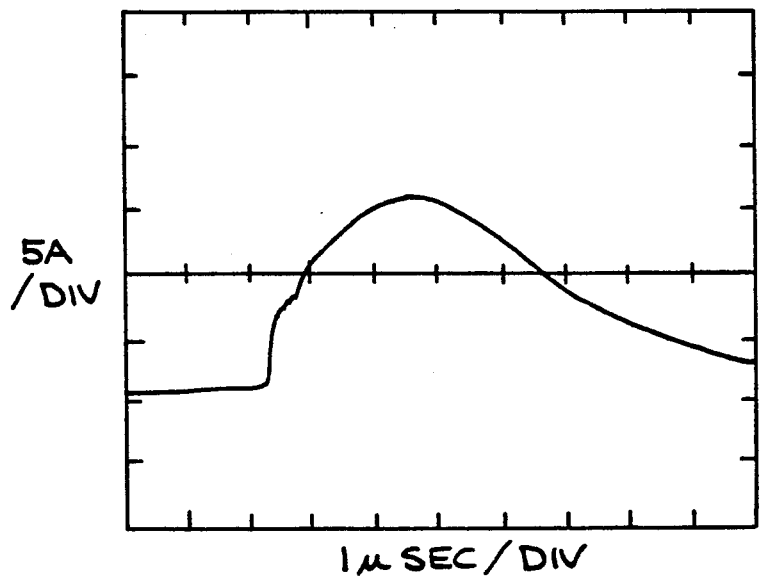
FIG. 4 diagrammatically represents a current pulse waveform created the switch illustrated in FIGS. 1A, 1B.

FIG. 4 gives a typical trigger pulse at the output of the trigger chassis. As a result of a parametric study of the gate trigger pulse, it was found that the RCTs 100 would operate with a gate current as small as 0.5 A or as large as 20 A for the wave shape illustrated in FIG. 4. For purposes of the prototype, the peak gate current was chosen at about 7.5 A per RCT device.

In testing the switch, the hold-off time of the magnetic assist was varied and data was collected at 200, 400, 600 and 800 nanoseconds. The energy storage means (resistor capacitor network) was also varied and data was collected for resistive values of 1.25, 2.5, 5.0 and 10 ohms, and capacitance values of 0.05, 0.1, 0.2 and 0.25 $\mu$F. During testing, switch voltage and current were monitored and performance was evaluated by estimating the conduction loss in the switch. This conduction loss usually correlated to the lowest voltage across the RCT. A magnetic assist hold-off time of 500 nanoseconds, a resistance value of 10 ohms, and a capacitance value of 0.05 $\mu$F were found to result in the lowest conduction loss for the values chosen.

As a result of testing, it was found that the lifespan of the switch was enhanced by reducing the capacitance value for the resistor-capacitance network. In this connection, it was found desirable to reduce the switch capacitance to a value of 0.05 µF as stated above.

The switch was found to present distinct operational differences from the thyratron in the manner of energy loss. This loss was found to be a result of two distinct components: conduction loss and energy stored in the resistor-capacitor network across each RCT.

The energy required for the resistor-capacitor network utilized in the switch may be calculated from the formula $\frac{1}{2}CV^2f$ where C equals capacitance, V equals voltage and f equals the pulse repetition frequency. Since the circuit was resonantly charged, very little energy was dissipated in the charge cycle. It was therefore assumed that the conduction energy loss was a result of the discharge of the network, which in this case was found to be 2.4%.

The second energy loss was evaluated by energy measurements performed on the energy transferred from a first to a second capacitor in a test. The voltages on the two capacitors was measured using a Teletronic P 6015 high voltage probe and a Tektronic 2430 oscilloscope. In order to compensate for this second energy loss, the value of the first intermediate storage capacitor was increased from 45 to 48.6 nF. The value of the second capacitor, however, was maintained at 45 nF.

As a result of these tests, it was possible to quantatively compare the thyratron and the solid state switch with respect to energy transfer. Table 1 represents the values obtained from these tests.

| | Thratron: | | |
|---|---|---|---|
| Powder Supply Voltage (kV) | $C_0 = 45nF$ Voltage (kV) | $C_1 = 45nF$ Voltage (kV) | Energy Lost % |
| 6 | 11.25 | 11.12 | 2.4 |
| 7 | 13.15 | 13.0 | 2.4 |
| 8 | 15.0 | 14. | 4.0 |
| 9 | 16.9 | 16.5 | 4.7 |
| 10 | 18.5 | 18.2 | 3.4 |
| 11 | 19.8 | 19. | 3.4 |
| | Solid-State Switch: | | |
| Powder Supply Voltage (kV) | $C_0 = 48.6nF$ Voltage (kV) | $C_1 = 45nF$ Voltage (kV) | Energy Lost % |
| 6 | 10.0 | 9.90 | 11.1 |
| 7 | 11.7 | 13.3 | 10.5 |
| 8 | 13.5 | 13.3 | 11.2 |
| 9 | 15.0 | 14.7 | 11.1 |
| 10 | 17.0 | 16.7 | 10.7 |
| 11 | 18.5 | 18.13 | 9.4 |

Two conclusions can be drawn from the data set out in Table 1. The first conclusion is that the switch has a greater energy loss than the thyratron. The second conclusion is that the relative energy losses from the switch are at lower voltages. The greater energy losses of the solid state switch can be explained in that RCTs have a relatively constant voltage drop as compared to the thyratron. Accordingly, the voltage drop across the solid state switch is not significantly dependent on conducted current. Not all energy loss, however, is dissipated in the RCT or thyratron. The losses illustrated in Table 1 represent the combination of magnetic assist losses, thyristor or stack loss, and resistive current loss.

The foregoing features of the present invention provide the advantage of operation of the RCT switches at pulses of 4.5 kHz and above with ±1 nanosecond of jitter in the presence of currents as high as 5000 A or more. It will be appreciated that this enables a laser driven by the current pulses developed by the RCT switch in accordance with the present invention to provide substantially more reliable operation than was previously possible. Such a laser would appear to have substantially continuous operation at high power since the current pulses in the present device develop 1250 A and above.

While there has been shown and described a preferred embodiment of a solid state switch for applications in power supplies for lasers it is to be understood that various other adaptations and modifications may be made within the spirit and scope of the invention.

We claim:

1. A switch for discharging a high energy storage capacitor, comprising:
   a circuit assembly comprising at least one reverse conducting thyristor, an energy storage means connected across the thyristor, and a voltage source triggering means connected to the thyristor;
   a saturable inductor connected to said reverse conducting thyristor, said inductor delaying a main current pulse received from traveling through the reverse conducting thyristor until such time as said thyristor is sufficiently actuated;
   a triggering chassis for receiving an external trigger pulse, said chassis including a capacitor connected to a high speed closing switch where said closing switch is connected to said voltage triggering means of said circuit assembly;
   voltage protection means connected to the reverse conducting thyristor to actuate the thyristor when a selected voltage has been exceeded, said voltage protection means including a shielded break-over diode.

2. The switch of claim I wherein said circuit assembly includes a plurality of circuit cards divided into two sets, where each set comprises an array of circuit cards connected in series, where each set of circuit cards is coupled in parallel.

3. The switch of claim 1 operative at a hold-off voltage of at least 20 kV, and a current pulse width of between 500 ns-5 µsec.

4. The switch of claim 1 wherein the di/dt (rise time of the main current pulse) is at least 3000 amperes/1 µsec.

5. The switch of claim I operable at a peak current in the range of 500-7000 amperes.

6. The switch of claim 1 operable at a maximum jitter of 1 nanosecond.

7. A triggering network for rendering conductive a plurality of series connected switches, each disposed on a separate circuit card assembly, each switch having a control lead, an output lead and an input lead, said triggering network comprising:
   a plurality of pulse generating means, each having a primary and a plurality of secondary windings for coupling trigger pulses to the control lead of a corresponding switch while blocking the flow of reflected currents from said switch through said pulse generating means to ground;
   a charge storage means for charging and discharging a high voltage pulse into the primary of each of said pulse generating means;
   a rectifier and filtering means connected to said secondary windings of said pulse generating means for allowing only trigger pulses of proper polarity to be passed through to said control lead of said switch and for suppressing high frequency oscillation;

pulse gating means connected between said rectifier and filtering means and said switch control lead for allowing trigger current pulses to flow in one direction only from said rectifier and filter means to the control leads of said plurality of switches.

8. A triggering network as in claim 7 wherein said pulse generating means comprises a pulse transformer having a primary winding connected across first and second input leads and a plurality of secondary windings inductively coupled with said primary winding connected across first and second output leads and wound on a single core so as to maximize primary to secondary coupling and to thereby maximize trigger pulse rise time and amplitude for generating trigger pulses of short duration.

9. An overvoltage protection network for ensuring substantially simultaneous activation of a plurality of switches comprising:
- a plurality of switches, each switch having a control lead and having respective input and output leads serially connected with an adjacent switch along a main current path;
- voltage detection means for detecting voltage across said plurality of switches and for producing a peak limited trigger pulse to trigger simultaneously said plurality of switches when voltage across said main input current path to said plurality of switches exceeds a critical value;
- current pulse shaping means for reducing high frequency oscillations in said peak limited trigger pulse;
- pulse gating means for receiving said peak limited trigger pulse and for ensuring that said peak limited trigger pulse flows toward the control leads of said switches and preventing extraneous trigger pulses from flowing away from said control leads.

10. An overvoltage protection network according to claim 9 wherein said voltage protection means comprises a break-over diode in series with a standard diode and one or more resistors, said voltage detection network being connected on said main current path between said series connected stack of switches and said pulse shaping means.

11. An overvoltage protection network as in claim 9 wherein said current pulse shaping means comprises a resistor and a capacitor connected in parallel which are in turn connected from one lead of said voltage detection means to a second current path lead to said stack of series connected switches.

12. A trigger driver circuit for providing trigger pulses for rendering a stack of a plurality of series connected switches simultaneously conductive, comprising:
- a plurality of trigger pulse generating means each connected with a control lead of a corresponding switch;
- a charge storage means for storing electric charge;
- a resonant charge circuit for providing electric charge to said charge storage means;
- a closing switch connected from said charge storage means to said stack of series connected switches for discharging said charge storage means through said series connected switches simultaneously and including means for allowing the discharged current of said charge storage means to reach high enough levels to provide adequate current drive pulses to all of said trigger generating means.

13. A trigger driver circuit according to claim 12 wherein said charge storage means comprises a capacitor and said trigger driver further includes means for adjusting the value of said capacitor and the equivalent inductance of the stack of series connected switches to thereby optimize the parameters of trigger current rise time, trigger current peak and trigger current pulse width.

14. A solid state switch for producing high voltage pulses of short duration comprising:
- a plurality of n switching elements each on a separate circuit card assembly, each switching element having an input lead, an output lead and a control lead, wherein a first switching element has an input lead for receiving a trigger current from a saturable inductor, or the like, and an output lead connected to the input lead of a successive switching element, said $n^{th}$ switching element having its output lead connected to a load;
- a trigger generator means disposed on each circuit card assembly having an input trigger line for receiving a trigger signal and an output lead connected to said control lead of a corresponding switching element;
- overvoltage protection means disposed on each circuit card assembly for monitoring the voltage across a corresponding switching element and including means for minimizing stray capacitance between said connected switching elements.

15. A switch according to claim 14 wherein said overvoltage protection means comprises a shielded break-over diode or the like for concentrating stray capacitance across said input lead and said output lead to prevent false triggering of said corresponding switch.

16. A circuit for producing high voltage, high frequency pulses comprising:
- a stack of serially connected switching elements, each disposed on a separate circuit card assembly, each switching element having a control lead, an input lead and an output lead wherein input and output leads of successive switching elements are connected in series to form a main current path;
- a plurality of trigger generating means, each disposed on a separate circuit card assembly and having an input lead and an output lead connected to the control lead of a corresponding switching element for generating trigger pulses on the leads of said switching elements to render said elements conductive;
- charge storage means for storing and discharging a high voltage pulse on each of said input leads of said trigger generator means;
- means for monitoring voltage across said stack of switching elements;
- circuit means, responsive to said means for monitoring for producing a high impedance to current flow through said main current path when voltage across said stack of switches is less than a predetermined level and for providing a low impedance to current flow through said main current path when voltage across the stack of switching reaches a predetermined threshold;
- energy storage means provided on each circuit card assembly for maximizing current density in each corresponding switching element for optimizing switching speed of said element.

17. A method for eliminating parasitic or stray capacitance, or the like in a plurality of connected switches generating high voltage pulses comprising the steps of:

sensing when voltage across at least two main current path leads of a corresponding one of a plurality of said switches becomes larger than a critical value;

triggering said corresponding switch to the conductive state with a trigger pulse to reduce said voltage across said main current path leads, including:

limiting the peak of the trigger pulse for triggering said switch when voltage across the main current path leads exceeds a critical value;

shaping the trigger pulse to reduce high frequency oscillation therein;

providing a pulse gating network to ensure that the peak limited trigger pulse flows toward said switch.

18. A method according to claim 17 wherein said step of detecting voltage comprises:

linking a break-over diode or other avalanche device in series with a standard diode and one or more resistors with one of said two main current path leads of the switch;

shielding the break-over diode or other avalanche device to thereby create stray capacitance directly across the terminals of said break-over diode or other avalanche device such that the avalanche device triggers the switch in case of an overvoltage.

* * * * *